United States Patent
Antognoli et al.

(10) Patent No.: US 11,418,028 B1
(45) Date of Patent: Aug. 16, 2022

(54) HEATER STATUS MONITOR

(71) Applicant: Whirlpool Corporation, Benton Harbor, MI (US)

(72) Inventors: Emanuela Antognoli, Fabriano (IT); Wojciech A. Barczyk, Lower Silesia (PL); Michal Pasiecznik, Lower Silesia (PL); Marco Quintini, Fabriano (IT); Waldemar Romanowski, Lower Silesia (PL)

(73) Assignee: Whirlpool Corporation, Benton Harbor, MI (US)

( * ) Notice: Subject to any disclaimer, the term of this patent is extended or adjusted under 35 U.S.C. 154(b) by 0 days.

(21) Appl. No.: 17/190,519

(22) Filed: Mar. 3, 2021

(51) Int. Cl.
*G01R 31/52* (2020.01)
*G01R 31/67* (2020.01)
(Continued)

(52) U.S. Cl.
CPC ........ *H02H 11/005* (2013.01); *A47L 15/0021* (2013.01); *A47L 15/4285* (2013.01);
(Continued)

(58) Field of Classification Search
CPC ...... H02H 11/005; G01R 31/52; G01R 31/67; A47L 15/0021; A47L 15/4285
See application file for complete search history.

(56) References Cited

U.S. PATENT DOCUMENTS 5,475,557 A * 12/1995 Larom ............... H02H 3/334
361/50
6,127,747 A 10/2000 Halvorson
(Continued)

FOREIGN PATENT DOCUMENTS

CN 100358204 C 12/2007
CN 104201647 B 6/2017
(Continued)

OTHER PUBLICATIONS

Schafhner EMV AG, Luterbach, Switzerland, Leakage Currents in Power Line Filters, Jul. 2008.

*Primary Examiner* — Scott Bauer
(74) *Attorney, Agent, or Firm* — Harness, Dickey & Pierce, PLC

(57) ABSTRACT

An appliance having a heater connectable to a power source to create a heater circuit is disclosed. The appliance includes a controller and a heater switch configured to be selectively closed in response to a control signal from the controller to complete the heater circuit and enable current to flow from the power source to the electric heater. The appliance further includes a heater feedback circuit comprising a plurality of resistors and configured to be connected to the power source and further configured to generate an output signal to the controller having a first state indicative of no current leakage from the heater circuit, a second state indicative of current leakage from the heater circuit where the polarity of the power source is normal, and a third state indicative of current leakage from the heater circuit where the polarity of the power source is reversed. The controller may determine whether current leakage exists in the heater circuit, regardless of the polarity of the grid lines from the power source. The controller may take various actions in response to such determination.

13 Claims, 5 Drawing Sheets

(51) Int. Cl.
*H02H 11/00* (2006.01)
*H02H 1/00* (2006.01)
*A47L 15/42* (2006.01)
*A47L 15/00* (2006.01)
*H05B 1/02* (2006.01)

(52) U.S. Cl.
CPC .......... *A47L 15/4287* (2013.01); *G01R 31/52* (2020.01); *G01R 31/67* (2020.01); *H02H 1/0007* (2013.01); *H05B 1/0252* (2013.01); *H05B 2203/035* (2013.01)

(56) References Cited

U.S. PATENT DOCUMENTS

| | | | |
|---|---|---|---|
| 6,795,285 B1* | 9/2004 | Jozwiak | H02H 3/33 361/45 |
| 9,842,714 B2 | 12/2017 | Reder et al. | |
| 2012/0134063 A1* | 5/2012 | Weil | H02H 9/041 361/118 |
| 2012/0206100 A1* | 8/2012 | Brown | B60L 53/65 320/109 |
| 2013/0015707 A1* | 1/2013 | Redmann | B60L 5/00 307/39 |
| 2014/0254050 A1* | 9/2014 | Haines | H02H 3/16 361/42 |
| 2017/0025846 A1* | 1/2017 | Du | H02H 3/335 |
| 2021/0223331 A1* | 7/2021 | Thornton | G01R 31/54 |

FOREIGN PATENT DOCUMENTS

| | | |
|---|---|---|
| KR | 20060041370 A | 5/2006 |
| WO | 2020118965 A1 | 6/2020 |

\* cited by examiner

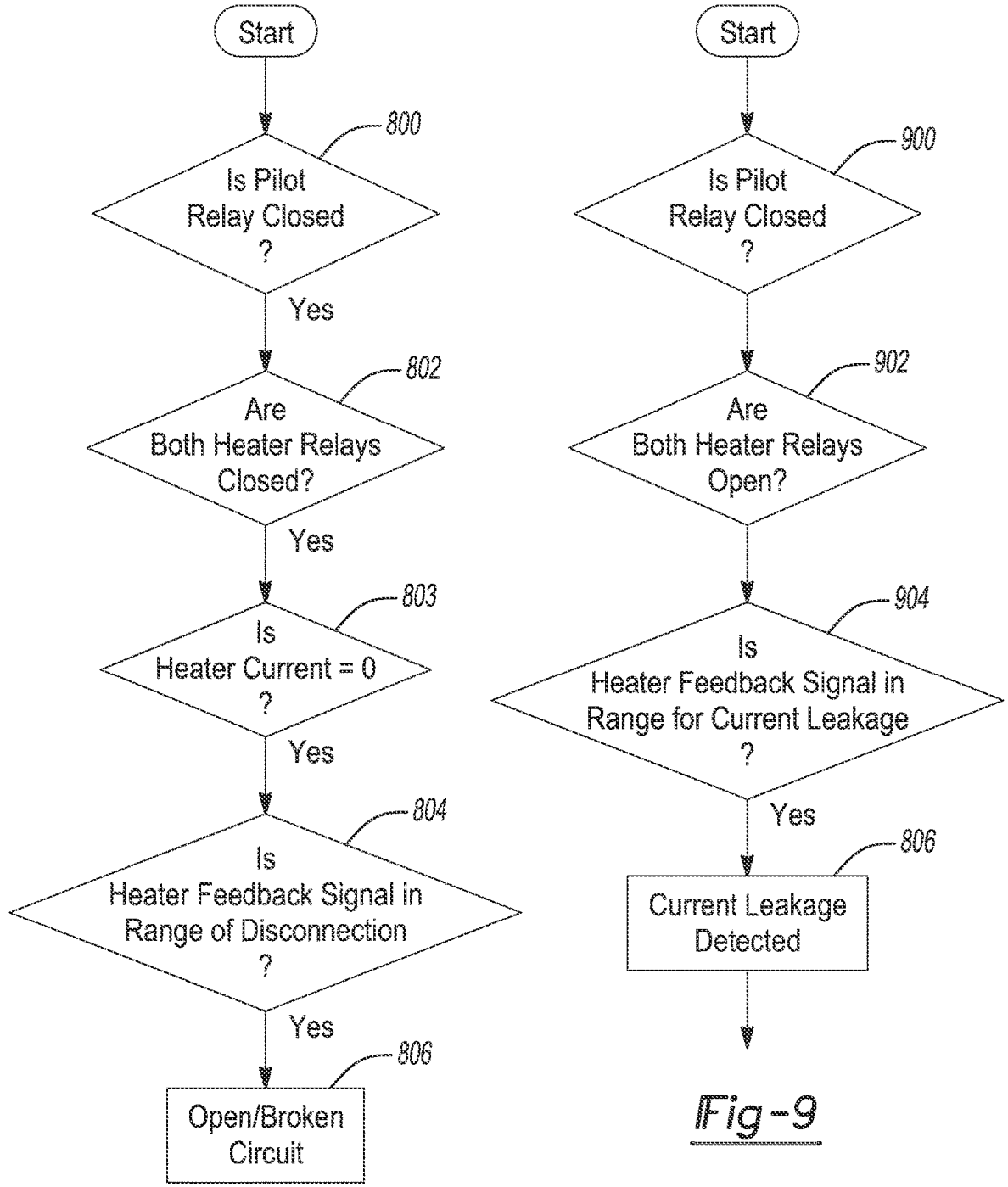

HEATER STATUS MONITOR

FIELD

The present disclosure relates to a system and method to detecting current leakage of a heater in an appliance.

BACKGROUND

Various appliances, such as dishwashers and dryers, commonly incorporate electric heaters, which are used by the appliance to heat the water and dry dishes, clothes and the like. It is known that current leakage can develop in the electrical circuit connecting the heater to the power source that provides electrical current to the heater. There are a variety of causes of current leakage, including degraded wire insulation, damaged electrical components and others. Current leakage can pose a risk of electrical shock, fire hazard and other potentially undesirable consequences. Accordingly, it is known to include various detection circuits, components and the like to detect current leakage in a heater circuit. However, known detection circuits, components, etc. are generally configured to detect current leakage from a heater circuit where the polarity of the electrical input to the circuit is normal (i.e., Line-Neutral). Known detection circuits, components, etc. are not configured to detect current leakage from the circuit regardless of whether the input source has normal polarity or reversed polarity (i.e., Neutral-Line), which may occur in various situations, such as where the source (e.g., home) electrical grid lines are reversed from normal polarity.

Therefore, it is desirable to improve the robustness of current leakage detection in appliances having electric heaters to be able to detect current leakage regardless of the polarity of the input, as well as other states of the heater operation.

SUMMARY

An appliance having a heater connectable to a power source to create a heater circuit is disclosed. The appliance includes a controller and a heater switch configured to be selectively closed in response to a control signal from the controller to complete the heater circuit and enable current to flow from the power source to the electric heater. The appliance further includes a heater feedback circuit comprising a plurality of resistors and configured to be connected to the power source and further configured to generate an output signal to the controller having a first state indicative of no current leakage from the heater circuit, a second state indicative of current leakage from the heater circuit where the polarity of the power source is normal, and a third state indicative of current leakage from the heater circuit where the polarity of the power source is reversed. The controller may determine whether current leakage exists in the heater circuit, regardless of the polarity of the grid lines from the power source. The controller may take various actions in response to such determination.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 1 schematically illustrates an appliance connected to a power source in a normal polarity configuration.

FIG. 2 schematically illustrates an appliance connected to a power source in a reversed polarity configuration.

FIG. 3 schematically illustrates additional detail of the appliance of FIG. 1 connected to a power source according to an embodiment.

FIG. 8 is a flow diagram illustrating exemplary steps in a method of determining if a heater circuit is open/broken.

FIG. 9 is a flow diagram illustrating exemplary steps in a method of determining if a heater circuit is experiencing current leakage.

Corresponding reference numerals indicate corresponding parts throughout the several views of the drawings.

DETAILED DESCRIPTION

Example embodiments will now be described more fully with reference to the accompanying drawings.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

Figure 1:
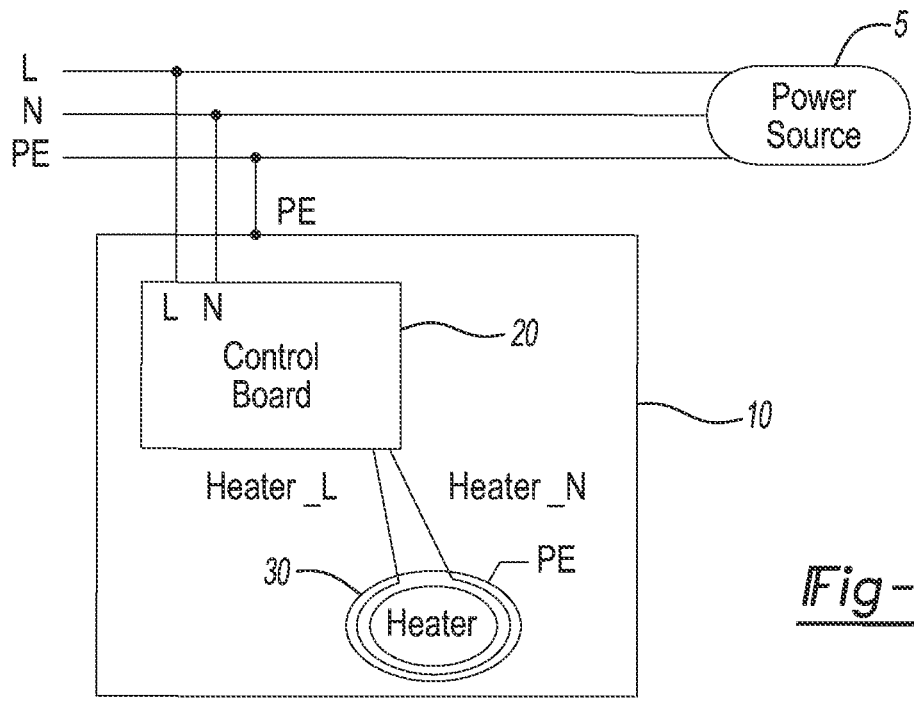

FIG. 1 schematically illustrates an appliance 10 connected to a power source 5 with normal polarity. Appliance 10 includes a control board 20 connected to a heater 30. Line L represents the line conductor and line N represents the neutral conductor of the power source 5. Line PE represents the ground conductor (i.e., potential earth). Line L is connected to terminal L of the appliance 10 and control board 20, and line N is connected to terminal N of the appliance 10 and control board 20, thereby enabling power to be provided to the appliance 10 according to normal polarity. Line PE is connected to a ground terminal of the appliance 10 and heater 30.

Figure 2:
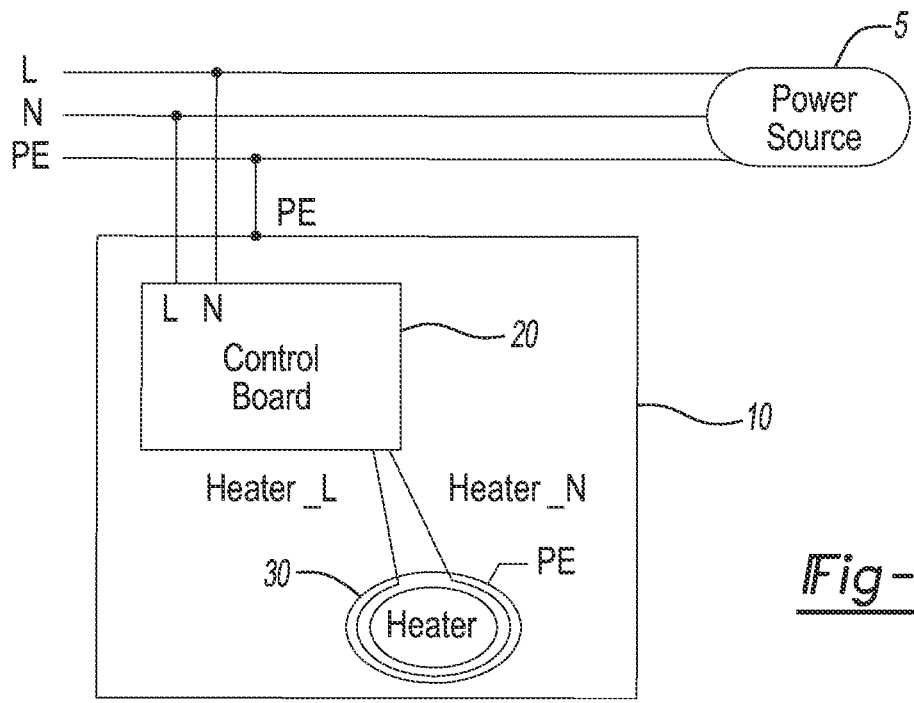

FIG. 2 is similar to FIG. 1, except that it illustrates the appliance 10 connected to the power source 5 with reversed polarity. Here, line L1 of the power source 5 is connected to terminal N of the appliance 10 and control board 20, and line N of the power source 5 is connected to terminal L of the appliance 10 and control board 20. (Line PE is still connected to a ground terminal of appliance 10 and heater 30).

The circuits, systems and methods described hereinafter accurately detect the existence of current leakage in the system between the heater 30 and the PE.

Figure 3:
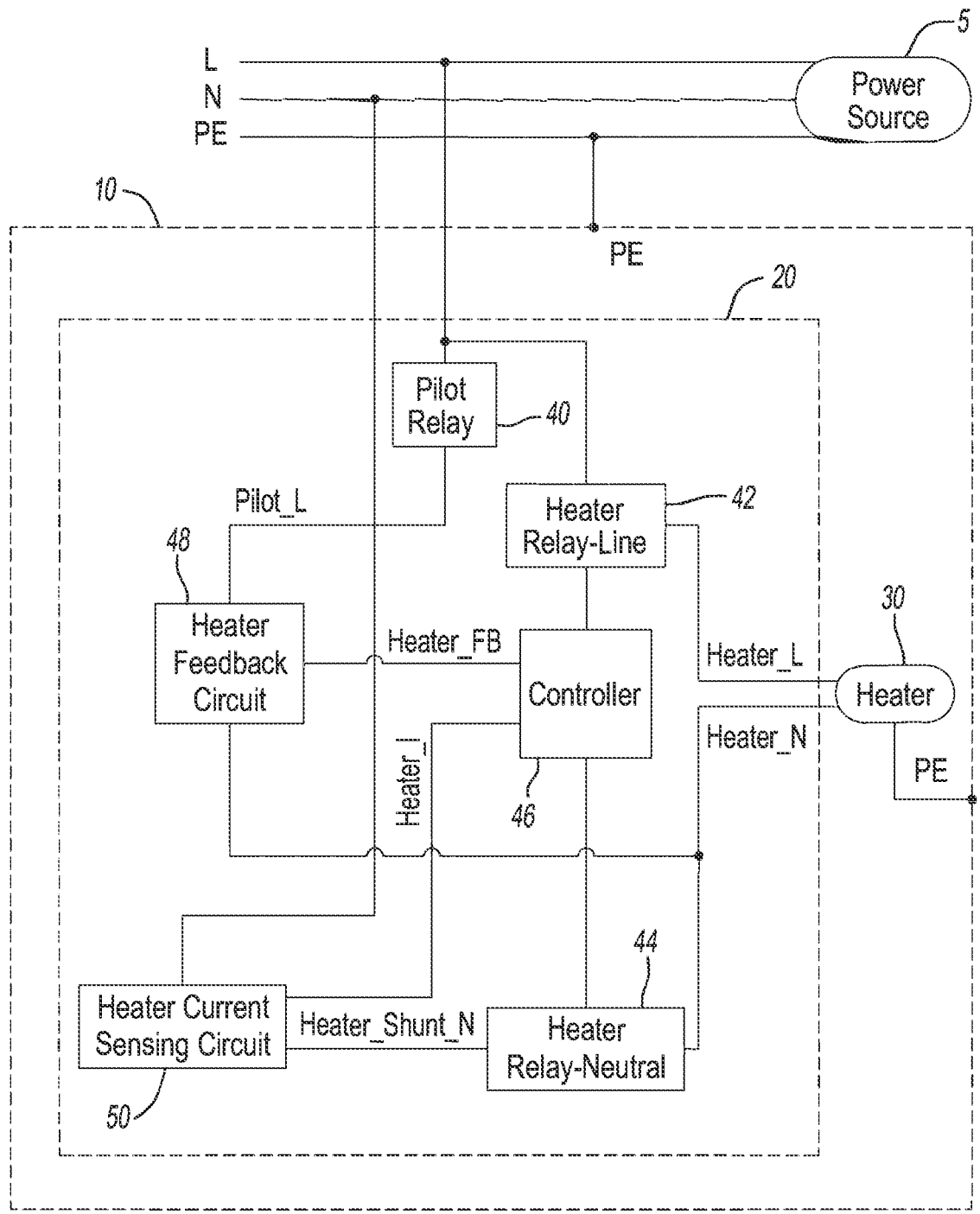

FIG. 3 schematically illustrates certain components of appliance 10 and control board 20 beneficial to explaining the system and method for detecting current leakage regardless of whether applicant 10 is connected according to FIG. 1 (normal polarity) or FIG. 2 (reversed polarity), as well as other conditions of the heater 30. Heater 30 may be connected to power source 5 via conductors Heater_L and Heater_N through a Heater Relay-Line 42 and a Heater Relay-Neutral 44, respectively. Pilot Relay 40 connects Heater Feedback Circuit 48 to the line conductor L of power source 5. Relays 40, 42 and 44 may be other types of switches as well. Pilot Relay 40 is ultimately responsive to an input from a user (not shown) to connect the appliance 10 to the power source 5, i.e., turning the appliance "on." Heater Relay-Line 42 and Heater Relay-Neutral 44 are closed/opened in response to control signals from controller 46. Controller 46 may close Heater Relay-Line 42 and Heater Relay-Neutral 44 to supply power to heater 30 based upon the determination of certain conditions based upon input signals.

One such input signal is received from Heater Feedback Circuit 48, and another such input is received from Heater Current Sensing Circuit 50. Heater Feedback Circuit 48 is connected to line conductor L (when pilot relay 40 is closed) and Heater N conductor of power source 5. Heater Feedback Circuit 48 is configured to generate an output signal Heater_FB from which it can be determined if current leakage is present (above some threshold), regardless of whether the appliance 10 is connected according to normal polarity or reversed polarity. Heater Current Sensing Circuit 50 is connected to neutral conductor N and Heater_Shunt_N. Heater Current Sensing Circuit 50 is configured to detect if current is flowing in the heater circuit to the heater 30. The outputs of Heater Feedback Circuit 48 (Heater_FB) and Heater Current Sensing Circuit 50 (Heater_I), along with the known status of Heater Relay-Line 42, Heater Relay-Neutral 44, and Pilot Relay 40, are used by controller 46 to determine if current is flowing to heater 30 and if there is current leakage present, regardless of the polarity of the source grid lines.

Figure 4:
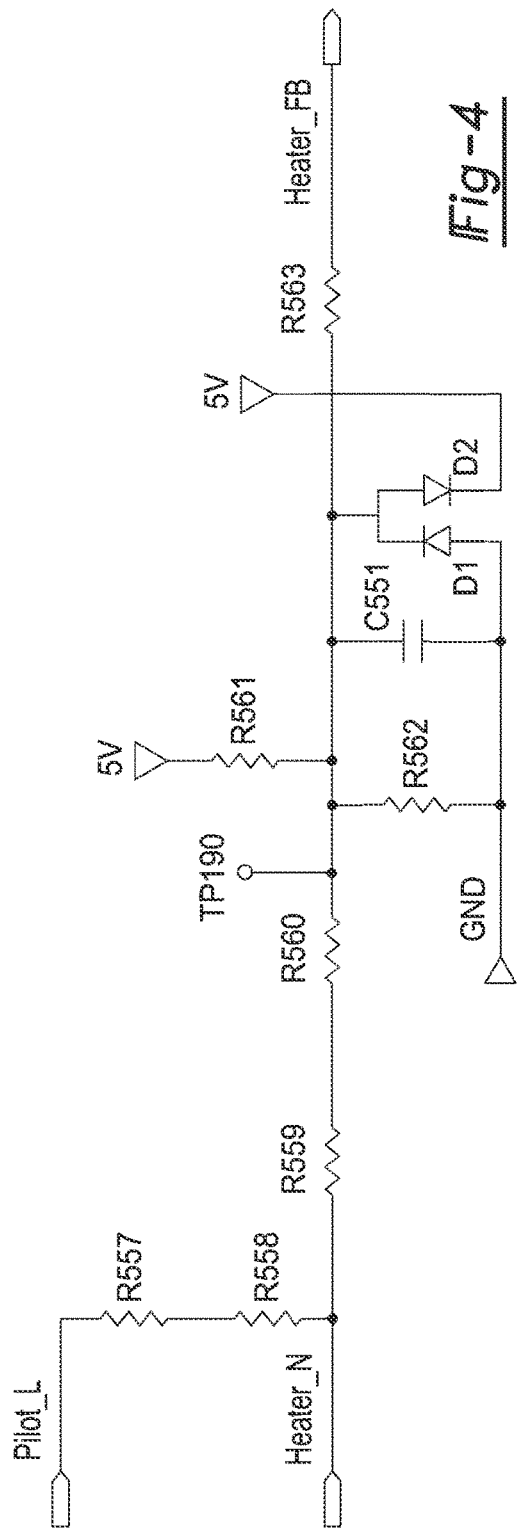
FIG. 4 is a circuit diagram of an exemplary Heater Feedback Circuit, which is schematically illustrated in FIG. 3.

FIG. 4 schematically illustrates an embodiment of Heater Feedback Circuit 48, which functions essentially as a resistive divider circuit. The Heater Feedback Circuit 48 is connected to conductors Pilot_L and Heater_N, which are intended to be the power line and neutral line. If the source grid lines are configured for normal polarity, then Pilot_L and Heater_N are connected to the line L and neutral N of the power source 5, respectively, as illustrated in FIG. 1. If the source grid lines are configured for reversed polarity, then Pilot_L and Heater_N are connected to the neutral N and Line L of the power source 5, respectively, as illustrated in FIG. 2. Resisters R557 and R558 are connected in series between inputs Pilot_L and Heater_N. Resistor 561 is connected in series between a 5 volt source and node TP190. Resistors 559 and 560 are connected in series between Resistor R558 and node TP190. Resistor R562 and capacitor 551 are connected in series between node TP190 and ground GND. Diodes D1 and D2 are connected between node TP190 and ground GND and between node TP190 and a 5 volt source, respectively. Resistor 563 is connected in series between node TP190 and the output Heater_FB of Heater Feedback Circuit 48. The output Heater_FB is an analog signal that is provided to controller 46.

In one particular embodiment of Heater Feedback Circuit 48, the components have the following values. Resisters R557, R558, R559, R560 all may have values of 220 K. Resistor R561 may be 5.6K and R562 may be 1.5 K. Resistor R563 may be 10 K. Capacitor 551 may be 0.001 UF. These component values are exemplary and other component values could be implemented with acceptable results within the scope of the invention.

Figure 5:
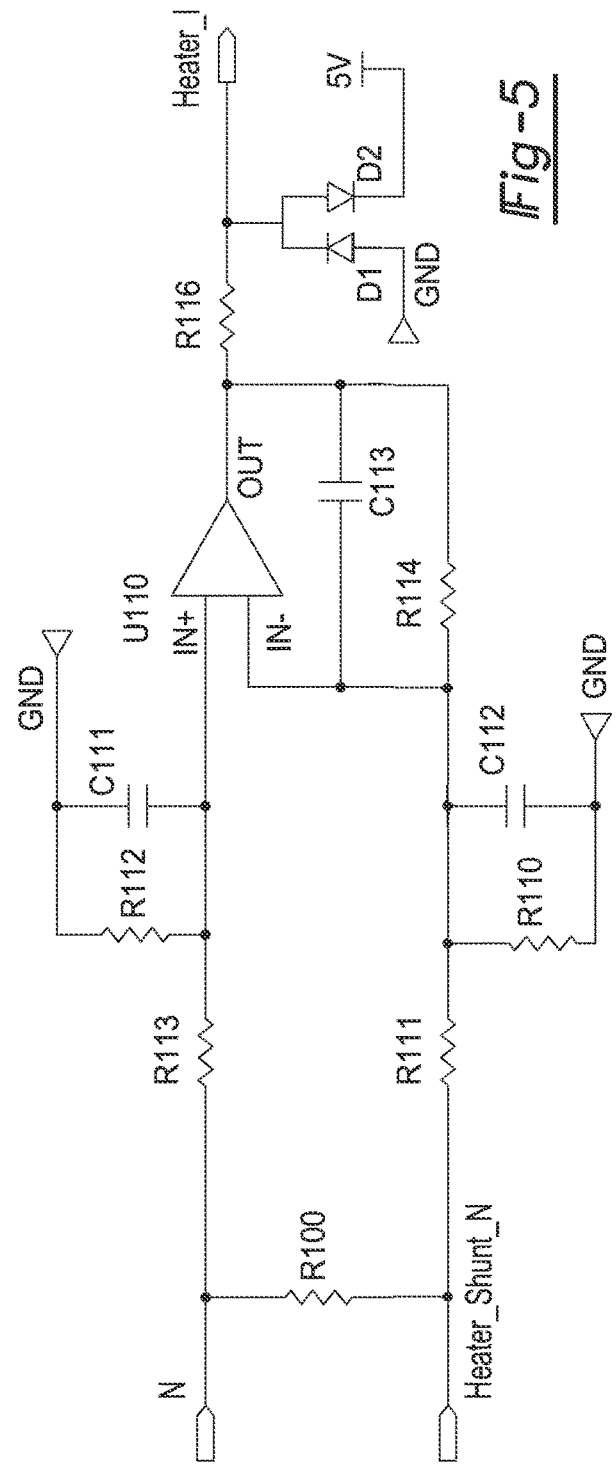
FIG. 5 is a circuit diagram of an exemplary Heater Current Sensing Circuit, which is schematically illustrated in FIG. 3.

FIG. 5 schematically illustrates an embodiment of Heater Current Sensing Circuit 50, which functions essentially as a current sensing circuit to determine whether current is flowing. The output of Heater Current Sensing Circuit 50 is a binary signal indicative of whether current flow is sensed. Circuit 50 is a differential amplifier that amplifies the difference between the two input voltages. Both inputs are connected to the shunt resistor (R100) and the heater current creates a voltage drop on this resistor. The output voltage from circuit 50 is an analog signal and it is proportional to the voltage drop on shunt resistor. The gain is defined by the R110-R114 resistors and the bias voltage is defined by the R112 and R113 resistors.

Figure 6C:
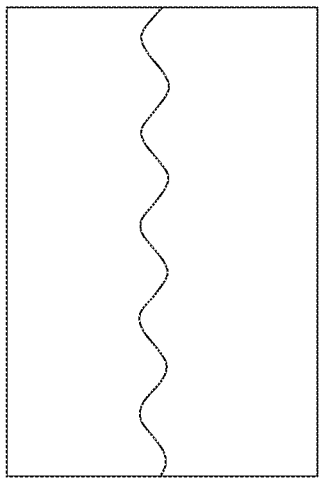
FIG. 6C illustrates the output of Heater Feedback circuit having 0.5 mA of current leakage to neutral.
Figure 7C:
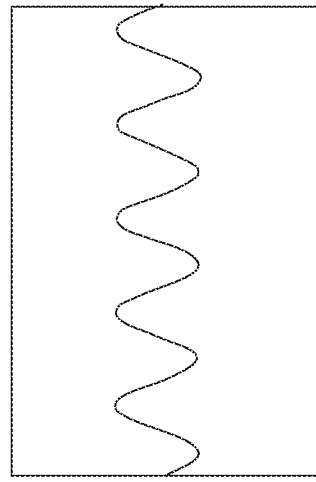
FIG. 7C illustrates the output of Heater Feedback circuit having 0.5 mA of current leakage to line.
Figure 6B:
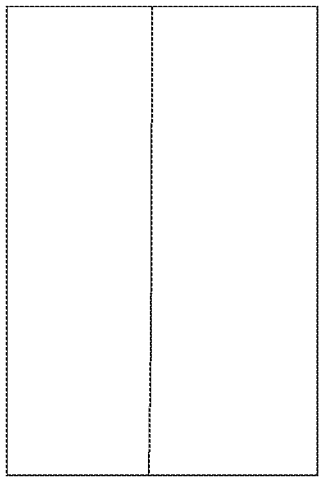
FIG. 6B illustrates the output of Heater Feedback circuit having 50 mA of current leakage to neutral.
Figure 7B:
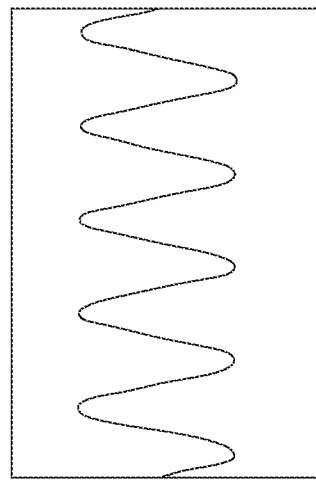
FIG. 7B illustrates the output of Heater Feedback circuit having 50 mA of current leakage to line.
Figure 6A:
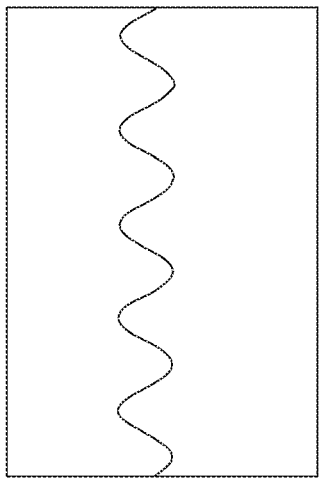
FIG. 6A illustrates the output of Heater Feedback circuit having no current leakage.
Figure 7A:
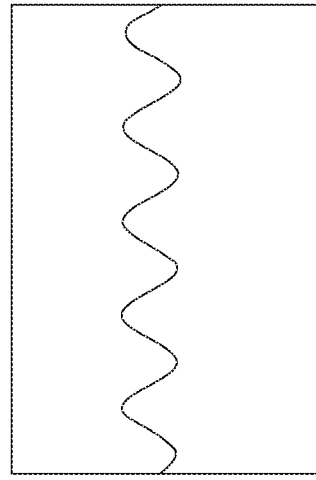
FIG. 7A illustrates the output of Heater Feedback circuit having no current leakage.

FIGS. 6 and 7 illustrate the nature of the output signal Heater_FB from Heater Feedback Circuit 48 over time, where Pilot Relay 40 is closed and Heater Relay-Line 42 and Heater Relay-Neutral 44 are open. This is a scenario in which the appliance has been turned "on," but the heater relays have not yet been closed to permit current to flow to the heater. FIG. 6 illustrates output signal Heater_FB where the source grid lines are configured with normal polarity, and FIG. 7 illustrates output signal Heater_FB where the source grid lines are configured with reversed polarity. Illustrations 6A and 7A are the same and illustrate Heater_FB where there is no current leakage (or current leakage less than an acceptable threshold), which results in a baseline sinusoidal output signal. The Illustrations 6B and 7B show Heater_FB where there is approximately 50 mA of current leakage. As shown in illustration 6B, the amplitude of the sinusoidal output signal Heater_FB is decreased relative to the baseline sinusoidal output illustrated in FIG. 6A, where the power grid is configured with normal polarity. Conversely, as illustrated in FIG. 7B, the amplitude of the sinusoidal output signal Heater_FB is increased relative to the baseline sinusoidal output illustrated in FIG. 7A, where the power grid is configured with reverse polarity. The illustrations 6C and 7C show Heater_FB where there is approximately 0.5 mA of current leakage, i.e., two orders of magnitude less than the current leakage associated with illustrations 6B and 7B. As shown in illustration 6C, the amplitude of the sinusoidal output signal Heater_FB is still less than the baseline sinusoidal output illustrated in illustration 6A, but not as reduced as in FIG. 6B. Similarly, as shown in illustration 7C, the amplitude of the sinusoidal output signal Heater_FB is still greater than the baseline sinusoidal output illustrated in illustration 7A, but not as increased as that illustrated in illustration 7B.

FIGS. 6 and 7 illustrate that the amplitude of the Heater_FB signal decreases relative to the amount of current leakage where the source power grid is configured with normal polarity. If the source power grid is configured with reverse polarity, then the amplitude of the Heater_FB signal increases relative to the amount of current leakage. Therefore, the controller 46 can determine from the Heater_FB signal if there is current leakage regardless of the polarity of the source grid lines.

Controller 46 can determine various states of the heater circuit based upon a combination of the relay states and the outputs of the Heater Feedback Circuit 48 and the Heater Current Sensing Circuit 50. As previously indicated, the controller 46 can determine if current leakage is present where Pilot Relay 40 is closed and Heater Relay-Line 42 and Heater Relay-Neutral 44 are open. Where Pilot Relay 40 is closed and Heater Relay-Line 42 and Heater Relay-Neutral 44 are also closed, the controller 46 can determine if the heater is operating normally or if there is an open/broken circuit. In particular, if all three relays are closed, and the output Heater_FB of Heater Feedback Circuit 48 does not indicate current leakage, and the output of Heater Current Sensing Circuit 50 indicates current flow, then the controller 46 can determine that the heater and heater circuit are operating normally. If all three relays are closed, and the Heater Current Sensing Circuit 50 indicates no current flow, then the controller 46 can determine that there is an open/broken circuit.

FIG. 8 illustrates steps in a method usable by controller 46 to determine if there is an open/broken circuit. At step 800, the controller 46 determines if the pilot relay 40 is closed. At step 802, the controller 46 determines if both heater relays 42 and 44 are closed. At step 803, the controller 46 determines if the heater current is zero based upon the output signal Heater_L from Heater Current Sensing circuit 50. At step 804, the controller 46 determines if the heater feedback signal Heater_FB from Heater Feedback circuit 48 is within a range known to be indicative of a disconnected circuit. If all conditions are met, then controller 46 determines at step 805 that there is an open/broken conductor in the heater circuit. Various actions can be taken in response to such determination, such as setting a fault code or indicator, etc.

FIG. 9 illustrates steps in a method usable by controller 46 to determine if there is current leakage in the heater circuit. At step 900, the controller 46 determines if the pilot relay 40 is closed. At step 902, the controller 46 determines if both heater relays 42 and 44 are open. At step 904, the controller 46 determines if the heater feedback signal Heater_FB from Heater Feedback Circuit 48 is within a range known for current leakage, such as if the amplitude of the signal is above a threshold or below a threshold relative to a baseline amplitude. If all conditions are satisfied, then at step 906 the controller 46 determines that current leakage is present in the heater circuit. Various actions can be taken in response to such determination, such as setting a fault code or indicator or preventing operation of the heater until service can be provided, etc.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

What is claimed is:

1. An appliance, comprising:
an electric heater connectable to a power source to create a heater circuit;
a controller;
a heater switch configured to be selectively closed in response to a control signal from the controller to complete the heater circuit and enable current to flow from the power source to the electric heater;
a heater feedback circuit comprising a plurality of resistors and configured to be connected to the power source and further configured to generate an output signal to the controller having a first state indicative of no current leakage from the heater circuit, a second state indicative of current leakage from the heater circuit where the polarity of the power source is normal, and a third state indicative of current leakage from the heater circuit where the polarity of the power source is reversed.

2. The appliance of claim 1, wherein the appliance is a dishwasher.

3. The appliance of claim 1 where the heater switch is a relay.

4. The appliance of claim 1, wherein the output signal of the heater feedback circuit comprises a sinusoidal wave and wherein the amplitude of the sinusoidal wave associated with the second state is less than the amplitude of the sinusoidal wave associated with the first state, and wherein the amplitude of the sinusoidal wave associated with the third state is greater than the amplitude of the sinusoidal save associated with the first state.

5. The appliance of claim 1, further comprising a heater current sensing circuit comprising a plurality of resistors connected to the heater circuit and configured to provide an output signal to the controller indicative of whether current is flowing to the heater.

6. The appliance of claim 1, wherein the controller is configured to determine whether a break exists in the heater circuit based at least in part on the output signal of the heater current sensing circuit and the output signal of the heater feedback circuit.

7. The appliance of claim 1, wherein the controller is configured to prevent operation of the heater if the controller determines there is current leakage in the heater circuit.

8. An appliance, comprising:
an electric heater connectable to a power source to create a heater circuit;
a controller;
a heater relay configured to be selectively closed in response to a control signal from the controller to complete the heater circuit and enable current to flow from the power source to the electric heater;
means for generating an output signal to the controller having a first state indicative of no current leakage from the heater circuit, a second state indicative of current leakage from the heater circuit where the polarity of the power source is normal, and a third state indicative of current leakage from the heater circuit where the polarity of the power source is reversed.

9. The appliance of claim 8, wherein the output signal of the means for generating an output signal comprises a sinusoidal wave and wherein the amplitude of the sinusoidal wave associated with the second state is less than the amplitude of the sinusoidal wave associated with the first state, and wherein the amplitude of the sinusoidal wave associated with the third state is greater than the amplitude of the sinusoidal save associated with the first state.

10. The appliance of claim 8, further comprising a means for generating an output signal to the controller indicative of whether current is flowing to the heater.

11. The appliance of claim 8, wherein the controller is configured to determine whether a break exists in the heater circuit based at least in part on the output signal of the heater current sensing circuit and the output signal of the heater feedback circuit.

12. The appliance of claim 8, wherein the controller is configured to prevent operation of the heater if the controller determines there is current leakage in the heater circuit.

13. A method of controlling an appliance having a heater connected to a power source through a heater circuit, comprising:
receiving an output signal from a heater feedback circuit, which is connected to the heater circuit, comprising a sinusoidal wave;
determining that current leakage in the heater circuit exists if the amplitude of the sinusoidal wave is less than the amplitude of a sinusoidal wave known to be indicative of no current leakage in the heater circuit;
determining that current leakage in the heater circuit exists if the amplitude of the sinusoidal save is greater than the amplitude of the sinusoidal wave known to be indicative of no current leakage in the heater circuit; and
preventing operation of the heater if it is determined that current leakage exists in the heater circuit.

* * * * *